United States Patent
Matsuhira

(10) Patent No.: US 10,319,623 B2
(45) Date of Patent: Jun. 11, 2019

(54) CONVEYANCE HAND, CONVEYANCE APPARATUS, LITHOGRAPHY APPARATUS, MANUFACTURING METHOD OF ARTICLE, AND HOLDING MECHANISM

(71) Applicant: CANON KABUSHIKI KAISHA, Tokyo (JP)

(72) Inventor: Yasunao Matsuhira, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/976,436

(22) Filed: May 10, 2018

(65) Prior Publication Data

US 2018/0350652 A1 Dec. 6, 2018

(30) Foreign Application Priority Data

May 30, 2017 (JP) .................. 2017-107066

(51) Int. Cl.
| | |
|---|---|
| *H01L 21/683* | (2006.01) |
| *B25J 15/06* | (2006.01) |
| *H01L 21/677* | (2006.01) |
| *G03F 7/20* | (2006.01) |
| *H01L 21/687* | (2006.01) |

(52) U.S. Cl.
CPC ...... *H01L 21/6838* (2013.01); *B25J 15/0616* (2013.01); *G03F 7/7075* (2013.01); *G03F 7/70691* (2013.01); *G03F 7/70783* (2013.01); *H01L 21/677* (2013.01); *H01L 21/67742* (2013.01); *H01L 21/68707* (2013.01)

(58) Field of Classification Search
CPC ................................................ H01L 21/1838
USPC ........................................ 294/213, 64.3, 183
See application file for complete search history.

(56) References Cited

U.S. PATENT DOCUMENTS

| | | | | |
|---|---|---|---|---|
| 6,942,265 | B1 * | 9/2005 | Boyd | H01L 21/67742 294/189 |
| 7,669,903 | B2 * | 3/2010 | Bonora | H01L 21/6838 294/188 |
| 9,108,320 | B2 * | 8/2015 | Furuichi | B25J 15/0616 |
| 9,757,865 | B1 * | 9/2017 | Chen | B25J 19/0091 |
| 9,829,802 | B2 * | 11/2017 | Matsuhira | H01L 21/6838 |
| 9,975,255 | B1 * | 5/2018 | Bosboom | H01L 21/6838 |
| 9,991,152 | B2 * | 6/2018 | Ingram-Goble | H01L 21/6838 |

(Continued)

FOREIGN PATENT DOCUMENTS

| | | |
|---|---|---|
| JP | H02271644 A | 11/1990 |
| JP | H0817896 A | 1/1996 |
| JP | H10308405 A | 11/1998 |

(Continued)

OTHER PUBLICATIONS

Office Action issued in Japanese Appln. No. 2017-107066 dated Jul. 27, 2018.

(Continued)

*Primary Examiner* — Paul T Chin

(74) *Attorney, Agent, or Firm* — Rossi, Kimms & McDowell LLP

(57) ABSTRACT

A conveyance hand for holding a conveyed object can include a base, a pad configured to suction the conveyed object, and a first support member fixed to the base and configured to support the pad. First support member can include three or more support members each configured to support the pad.

20 Claims, 10 Drawing Sheets

(56) References Cited

U.S. PATENT DOCUMENTS

2012/0235335 A1* 9/2012 Hayashi .............. H01L 21/6838
                                                                 269/21
2015/0246447 A1* 9/2015 Furuichi .......... H01L 21/67766
                                                                 294/188

FOREIGN PATENT DOCUMENTS

| JP | 2015013359 A | 1/2015 |
| JP | 2015160306 A | 9/2015 |
| JP | 5929947 B2 | 6/2016 |
| JP | 2016157822 A | 9/2016 |
| TW | 201631691 A | 9/2016 |

OTHER PUBLICATIONS

English Translation of Japanese Publication No. H02271644 published on Nov. 6, 1990. Previously cited on Aug. 2, 2018.

Office Action issued in Taiwanese Appin. No. 107114444 dated Mar. 18, 2019. English translation provided.

* cited by examiner

CONVEYANCE HAND, CONVEYANCE APPARATUS, LITHOGRAPHY APPARATUS, MANUFACTURING METHOD OF ARTICLE, AND HOLDING MECHANISM

BACKGROUND OF THE INVENTION

Field of the Invention

The present invention is related to a conveyance hand, a conveyance apparatus, a lithography apparatus, a manufacturing method of an article, and a holding mechanism.

Description of the Related Art

In a conveyance apparatus in which a substrate such as a wafer for semiconductor device manufacturing or a glass plate for liquid crystal display device manufacturing is a conveyed object, typically the conveyed object is suctioned (held) by a conveyance hand having a suction pad and conveyed. However, when warpage or distortion occurs in the conveyed object, the surface of the conveyed object (target suction surface) and the suction surface of the suction pad do not match, and so good suction is not possible. Accordingly, a conveyance hand in which a suction pad is supported by an elastic member, and while the suction surface of the suction pad is caused to assume the shape of the surface of the conveyed object, a vacuum is formed by an elastic member arranged below a suction pad has been proposed in Japanese Patent No. 5929947 and Japanese Patent Laid-Open No. 2016-157822.

In recent years, in semiconductor exposure processes, there is demand for conveyance of substrates (reconfiguration substrates) in which a chip has been reconfigured on a resin. In a reconfiguration substrate, warpage of the substrate tends to be larger than in conventional substrates (silicon wafers). Also, among reconfiguration substrates, the warpage shape may differ depending on the position of the periphery of the substrate, and the warpage direction may in both longitudinal and latitudinal directions in relation to a substrate surface.

In the techniques disclosed in Japanese Patent No. 5929947 and Japanese Patent Laid-Open No. 2016-157822, the force (rigidity) necessary for causing the suction surface of the suction pad to assume the shape of the surface of the conveyed object changes depending on the direction in which the elastic member for supporting the suction pad is arranged. Accordingly, in the case where the conveyed object is warped in a complex way, an amount of deformation in a specific direction of the elastic member is insufficient, the surface of the conveyed object and the suction surface of the suction pad will not match, and good suction will not be possible. Also, when, to increase the amount of deformation in a specific direction of the elastic member, its rigidity is lowered, the rigidity in the conveyance direction becomes lower, and therefore it ceases to be possible to hold the conveyed object with high positioning accuracy.

SUMMARY OF THE INVENTION

The present invention provides a conveyance hand that is advantageous at holding a conveyed object with high positioning accuracy.

According to one aspect of the present invention, there is provided a conveyance hand for holding a conveyed object, the conveyance hand including a base, a pad configured to suction the conveyed object, and a first elastic member fixed to the base and configured to support the pad, wherein the first elastic member includes three or more support units each configured to support the pad, and is configured so that a rigidity in a vertical direction is lower than a rigidity in a horizontal direction such that the pad conforms to a shape of the conveyed object.

Further features of the present invention will become apparent from the following description of exemplary embodiments with reference to the attached drawings.

DESCRIPTION OF THE EMBODIMENTS

Figure 1:
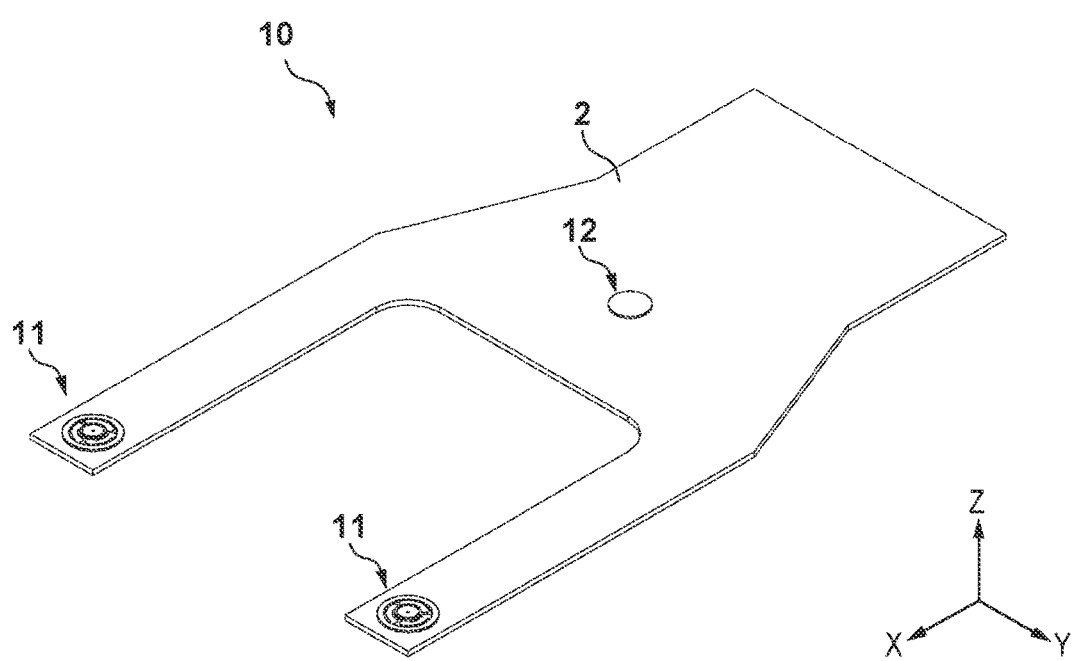
FIG. 1 is a schematic perspective view showing a configuration of a conveyance hand according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic perspective view showing a configuration of a conveyance hand 10 according to an aspect of the present invention. The conveyance hand 10 is removably installed in a conveyance apparatus for conveying, as a conveyed object, a substrate such as a wafer for manufacturing of a semiconductor device or manufacturing of a glass plate for a liquid crystal display device, for example, and holds the conveyed object by suction. Hereinafter, a direction orthogonal to the holding surface on which the conveyance hand 10 holds the conveyed object is defined as the Z-axis, and, in the corresponding holding surface, a direction in which the conveyance hand 10 is attached to the conveyance apparatus is defined as the X-axis, and a direction orthogonal to the X-axis is defined as the Y-axis.

As shown in FIG. 1, the conveyance hand 10 includes a base 2 which configures the main body of the conveyance hand 10, a suction pad unit 11 arranged on the base 2, and a support pad unit 12 arranged on the base 2. The suction pad unit 11 and the support pad unit 12 support the conveyed object by being in contact with the back surface of the conveyed object. The suction pad unit 11 generates a suction force due to a negative pressure on the conveyed object. The support pad unit 12 supports the conveyed object in the Z-axis direction.

In the present embodiment, two suction pad units 11 and one support pad unit 12 are arranged on the base 2 as shown in FIG. 1. However, the number of suction pad units 11 and support pad units 12 arranged on the base 2 are not limited to this. For example, if it is possible to hold the conveyed object with good balance with respect to weight, three or more suction pad units 11 may be arranged without arranging the support pad unit 12. Also, the base 2 is, on the whole, a planar member, and has a shape on which it is possible to arrange suction pad units 11 at positions at which a conveyed object can be held with good balance with respect to weight (for example, positions that capture the center of gravity of the conveyed object).

Figure 2A:
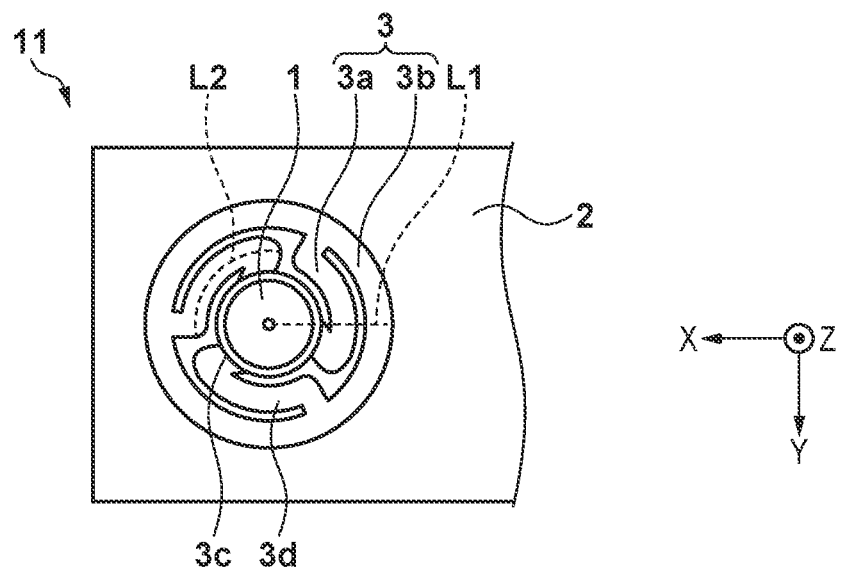
FIG. 2A and FIG. 2B are plan views of a suction pad unit of the conveyance hand shown in FIG. 1.
Figure 2B:
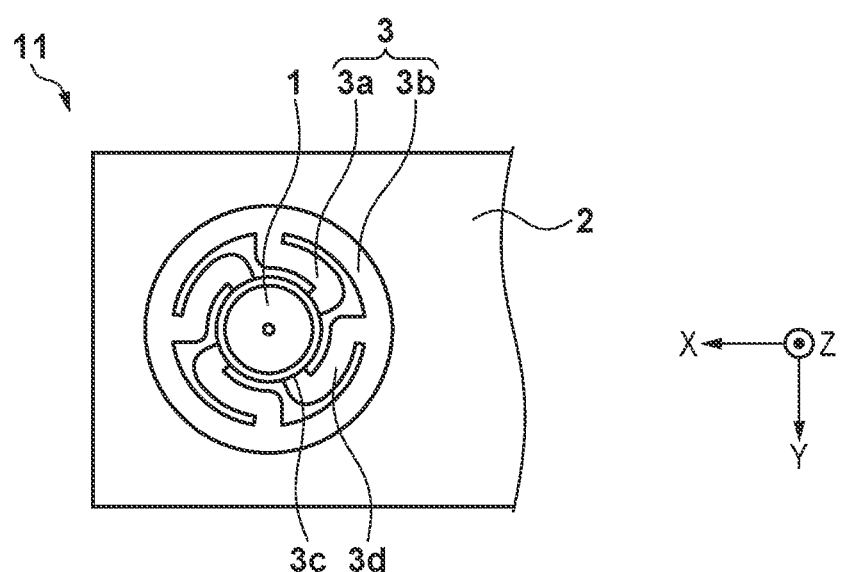
Figure 3:
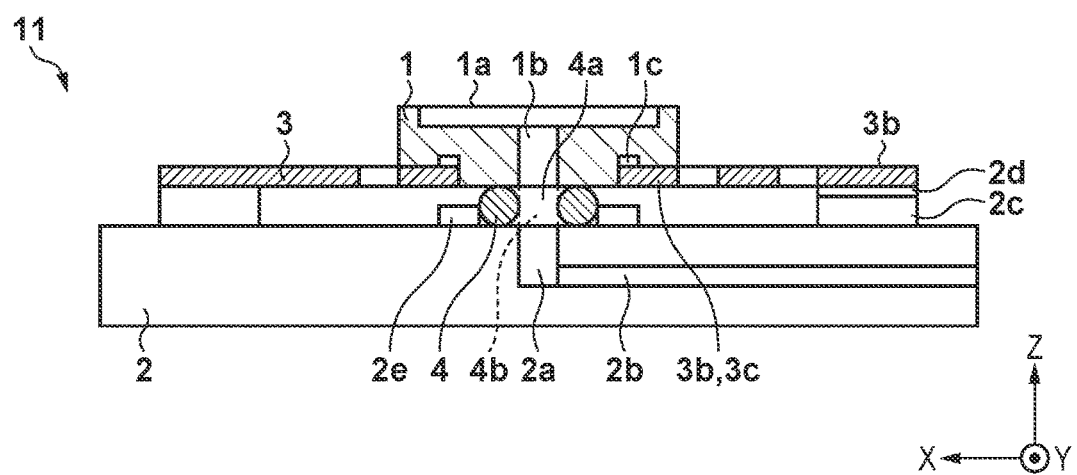
FIG. 3 is a cross-sectional view of the suction pad unit of the conveyance hand shown in FIG. 1.

FIG. 2A and FIG. 2B are plan views of the suction pad unit 11. FIG. 3 is a cross-sectional view of the suction pad unit 11. The suction pad unit 11 includes a pad 1, a leaf spring 3, and an O ring 4. Here, the pad 1 and the leaf spring 3 function as a holding mechanism used on the conveyance hand 10 for holding the conveyed object.

The pad 1 has a circular outer shape and forms a suction surface (a suction region) for suctioning the conveyed object. Specifically, the pad 1 includes a suction groove 1a that forms a suction surface facing the conveyed object in a state in which the suction surface is in contact with the conveyed object and a through hole 1b. One end of the through hole 1b communicates with the suction groove 1a and the other end of the through hole 1b opens to the base 2 (is open toward the base 2).

The base 2 includes an exhaust hole 2a and a channel 2b internally. One end of the exhaust hole 2a opens to the pad 1 (is open toward the pad 1). The exhaust hole 2a is formed so as to be approximately concentric with the suction groove 1a of the pad 1 when the pad 1 is arranged on the base 2, for example. One end of the channel 2b communicates with the exhaust hole 2a, and the other end of the channel 2b opens to the exterior so as to communicate with an exhaust unit (not shown) for exhausting air of the suction groove 1a (is open toward the exterior). Accordingly, the exhaust hole 2a, cooperating with the channel 2b, functions as a hole. One end of the hole communicates with the exhaust unit and the other end of the hole opens to the pad 1.

The leaf spring 3 is fixed to the base 2 and functions as a first elastic member that supports the pad 1 at three points or more. In the present embodiment, the leaf spring 3 is configured such that it includes three or more support units 3a that each support the pad 1 and the rigidity in a vertical direction (Z-axis direction) is less than the rigidity in horizontal directions (X-axis direction and Y-axis direction) such that the pad 1 conforms to the shape of the conveyed object. In other words, the leaf spring 3 supports the pad 1 such that it allows displacement in the vertical direction of the pad 1 and restricts displacement in the horizontal direction of the pad 1. In this way, the leaf spring 3 has a flexibility that conforms to the shape of the conveyed object by the weight of the conveyed object, in other words, conforms to the tilt of the warpage or deformation of the conveyed object in the Z tilt direction ($\omega x$ direction and $\omega y$ direction), and has a rigidity that can restrict the position of the pad 1 in the XY plane direction.

The leaf spring 3 may be configured to have three support members 3a as shown in FIG. 2A, and may be configured to have four support members 3a as shown in FIG. 2B. The more support units 3a there are, the more the rigidity in the XY plane direction improves, although the flexibility of the Z tilt direction decreases. Also, the support units 3a each include a curved portion 3d that extends in the same direction along the periphery of the pad 1 from the contact portion 3c with respect to the pad 1. In order to achieve sufficient flexibility in the Z tilt direction, the support unit 3a has a total length L2 that is longer than a distance L1 between the center position of the pad 1 and a fixing position at which the leaf spring 3 is fixed to the base 2 as shown in FIG. 2A.

The support unit 3a of the leaf spring 3 is arranged with rotational symmetry about the pad 1. By this, it is possible to reduce the rigidity difference in the $\omega x$ direction and the $\omega y$ direction in the Z tilt direction, and therefore irrespective of the direction of the leaf spring 3, specifically the arrangement relationship of the support units 3a in related to the pad 1, the pad 1 can conform the shape of the conveyed object.

Figure 4:
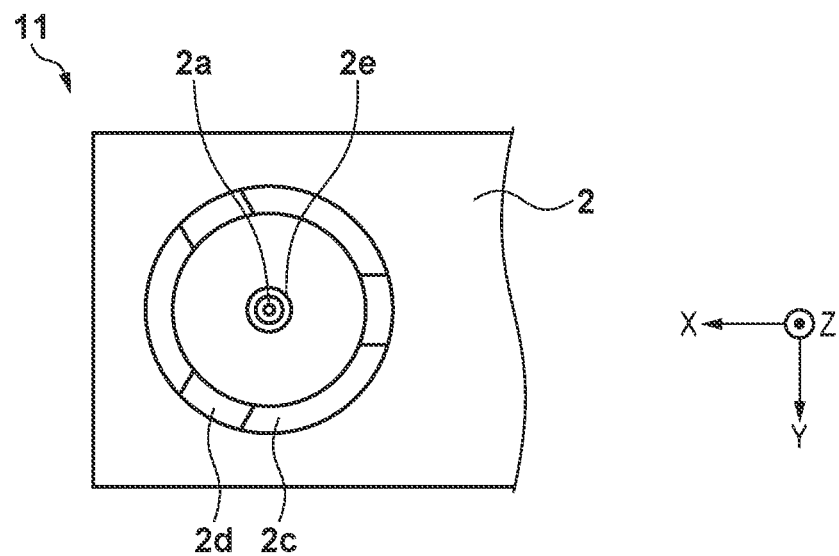
FIG. 4 is a plan view of a base of the suction pad unit shown in FIG. 2A, FIG. 2B, and FIG. 3.

One end (the support unit 3a) of the leaf spring 3, as shown in FIG. 3, is connected to the bottom surface (the back surface on the side opposite to the suction surface) of the pad 1, and the other end (the later described connecting portion 3b) of the leaf spring 3 is connected to the top surface of a support base 2c formed on the base 2 so as to have a constant height. On the bottom surface of the pad 1, as shown in FIG. 3, a groove 1c is formed. Also, in the support base 2c, as shown in FIG. 3 and FIG. 4, a groove 2d is formed. An adhesive agent is applied to the groove 1c, and the pad 1 and the leaf spring 3 are connected thereby. Similarly, an adhesive agent is applied to the groove 2d, and the support base 2c and the leaf spring 3 are connected thereby. By this, the pad 1 and the support base 2c (the base 2) are both in direct contact with the leaf spring 3, and therefore it is possible to guarantee conductivity from the pad 1 to the base 2 via the leaf spring 3. Here, FIG. 4 is a plan view of a state in which the pad 1 and the leaf spring 3 are removed from the suction pad unit 11 shown in FIG. 2A, specifically of the base 2.

Figure 5:
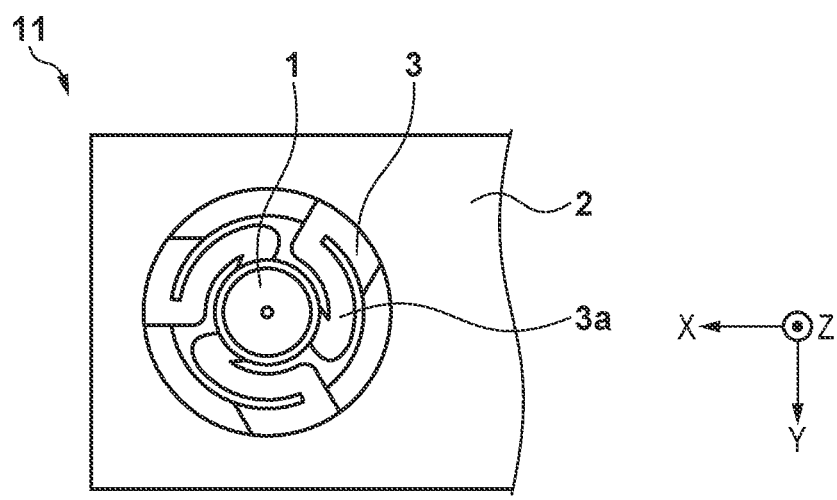
FIG. 5 is a plan view of the suction pad unit of the conveyance hand shown in FIG. 1.

The leaf spring 3, in the present embodiment, as shown in FIG. 2A, includes the connecting portion 3b which has an annular shape that connects the end of the support unit 3a on the side opposite to the end (the contact portion 3c) on the side in contact with the pad 1. The leaf spring 3, as shown in FIG. 3, is fixed to the base 2 via the connecting portion 3b. Accordingly, since it is possible to fix three or more support units 3a to the base 2 integrally, it is possible to simplify the work in fixing the support units 3a to the base 2. However, as shown in FIG. 5, configuration may be taken such that the leaf spring 3 does not include the connecting portion 3b. In such a case, the end of each of the support units 3a on the side opposite to the end on the side in contact with the pad 1 may be fixed to the base 2. FIG. 5 is a plan view of the suction pad unit 11.

The leaf spring 3 is configured by SUS (stainless steel) material, for example, and is made to have a thickness of 0.03 mm and a width of 3 mm, and the length of the support unit 3a is 15 mm. In such a case, the order of the spring constant of the leaf spring 3 is $10^6$ N/m in XY plane directions and 10 N/m in the Z tilt direction, and it is possible to satisfy the condition that the rigidity in the vertical direction be lower than the rigidity in the horizontal direction.

The O ring 4 is a ring shape member that includes a hollow portion 4a, and is in contact with both the pad 1 and the base 2 therebetween, and can deform in the Z-axis direction. The O ring 4 is restricted in the X-axis direction and Y-axis direction by a support unit 2e formed on the base 2. In this way, the O ring 4 is arranged between the base 2 and the pad 1, and can deform in a vertical direction of the pad 1, and functions as a second elastic member for supporting the pad 1.

The O ring 4, as shown in FIG. 3, is arranged between the base 2 and the pad 1 so as to form a channel 4b through which a hollow portion 4a communicates with the through hole 1b and the exhaust hole 2a. Thereby, the airtightness of the space formed by the suction groove 1a, the through hole 1b, the channel 4b, the exhaust hole 2a, and the channel 2b is maintained.

Also, the O ring 4 is fixed by an adhesive agent or the like with respect to the base 2, and can be in contact with (adhere to) and separate from the pad 1 without being fixed thereto. Note that the O ring 4, in FIG. 3, is in contact with only the pad 1, but that configuration may be taken such it is in contact with the leaf spring 3 if it is possible to maintain the airtightness in the contact surface of the leaf spring 3.

Figure 6:
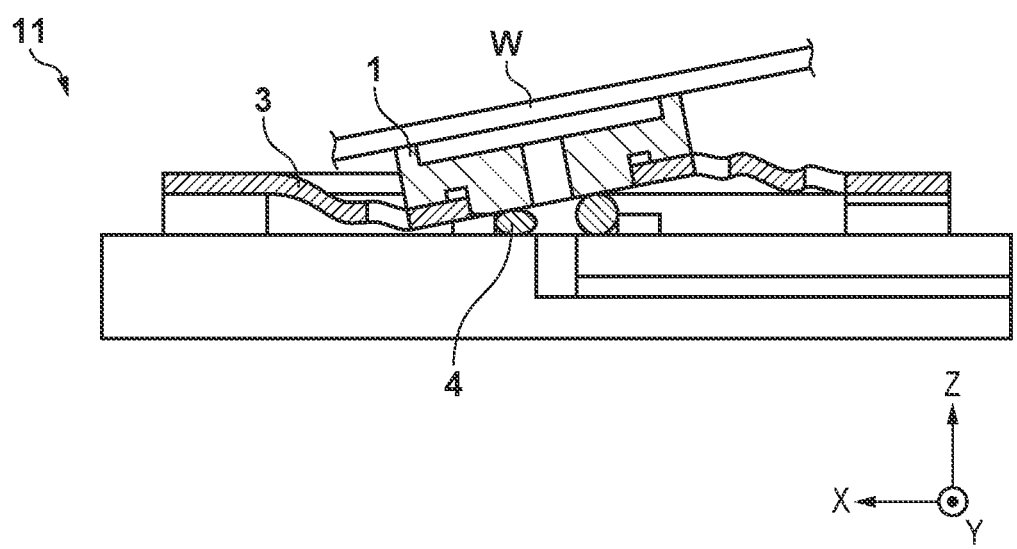
FIG. 6 is a cross-sectional view of the suction pad unit of the conveyance hand shown in FIG. 1.

FIG. 6 shows a state in which the leaf spring 3 bears the weight of a conveyed object W, and is deformed in the Z tilt direction (is twisted and bent), and in which the pad 1 supported on the leaf spring 3 is tilted to conform to the shape (warpage or the like) of the conveyed object W. In the present embodiment, the rigidity in the horizontal direction of the leaf spring 3, is greater than the rigidity in the vertical direction as described above. Accordingly, since it is possible for the pad 1 (the suction pad unit 11) to inhibit movement (position shift) in the horizontal direction while conforming to the shape of the conveyed object W, the conveyance hand 10 can maintain a high positioning accuracy with respect to the conveyed object W. At that time, since the O ring 4 deforms by its elasticity, the airtightness of the space formed by the suction groove 1a, the through hole 1b, the channel 4b, the exhaust hole 2a, and the channel 2b is maintained.

Figure 7A:
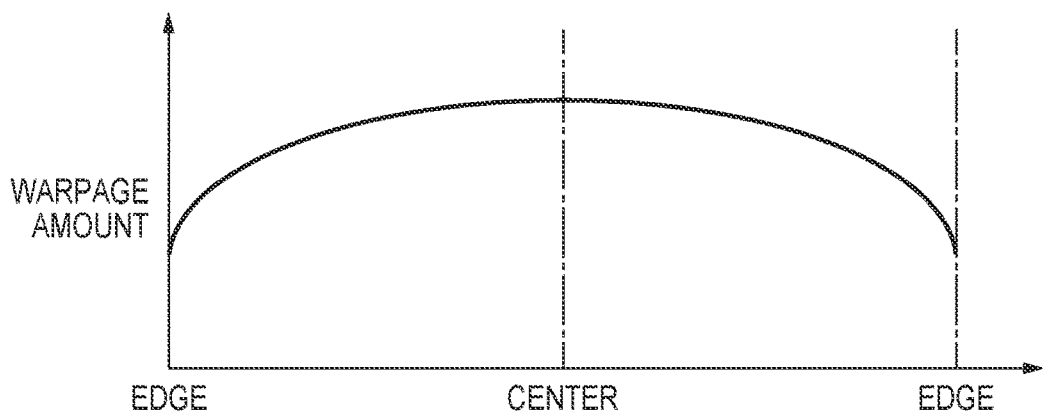
FIG. 7A to FIG. 7C are views showing examples of shapes of a conveyed object (a reconfiguration substrate).
Figure 7B:
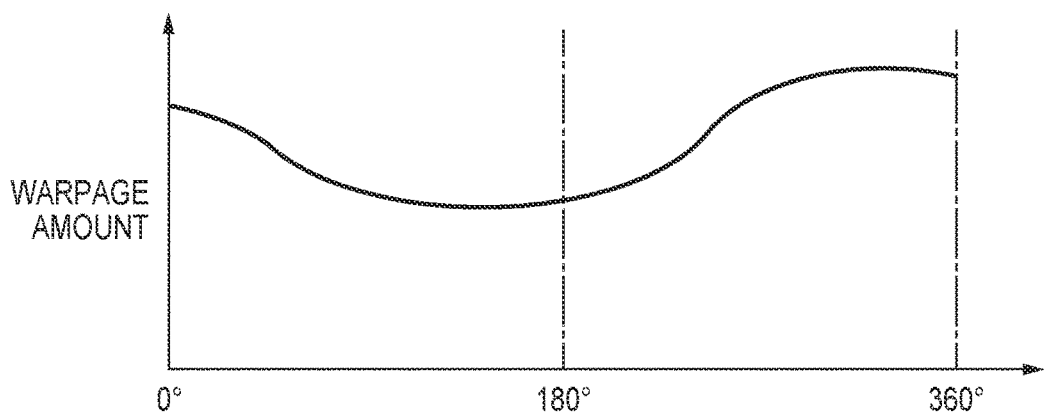
Figure 7C:
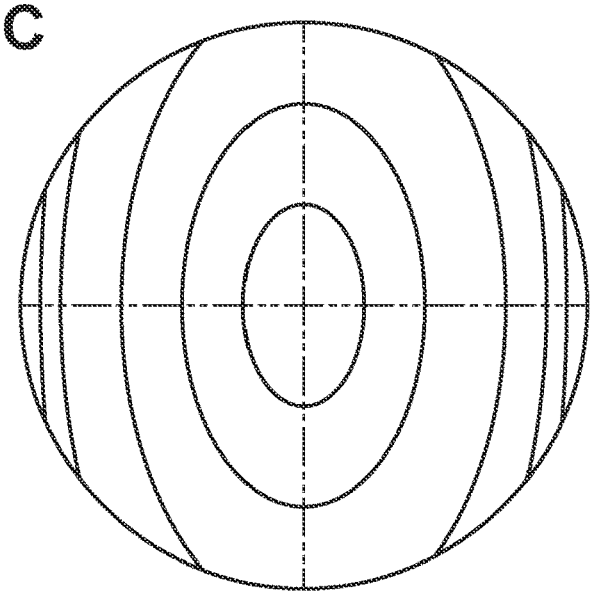

FIG. 7A to FIG. 7C are views showing shapes of substrates (reconfiguration substrates) as an example of a conveyed object. Thus far, the warpage of substrates was often of a shape in which the periphery was uniformly deformed (bowl shape). However, in recent years, in semiconductor exposure processing, there are reconfiguration substrates in which a chip is reconfigured on a resin, and warpage in such reconfiguration substrates is often of a shape that is not uniform over the periphery (saddle shape). A reconfiguration substrate may have a shape as shown in FIG. 7A in a diameter direction and have a shape as shown in FIG. 7B in a peripheral circumferential direction, for example. In FIG. 7A, the ordinate indicates a warpage amount of the reconfiguration substrate, and the abscissa indicates a position in a diameter direction of the reconfiguration substrate. In FIG. 7B, the ordinate indicates a warpage amount of the reconfiguration substrate, and the abscissa indicates a position (angle) in a peripheral circumferential direction of the reconfiguration substrate. Also, FIG. 7C represents in contour lines the shape of the reconfiguration substrate shown in FIG. 7A and FIG. 7B. In order for (the suction surface) of the pad 1 to conform to such a substrate, the rigidity in the Z tilt direction must be lower than that of both the $\omega x$ direction and the $\omega y$ direction (any direction).

Figure 8A:
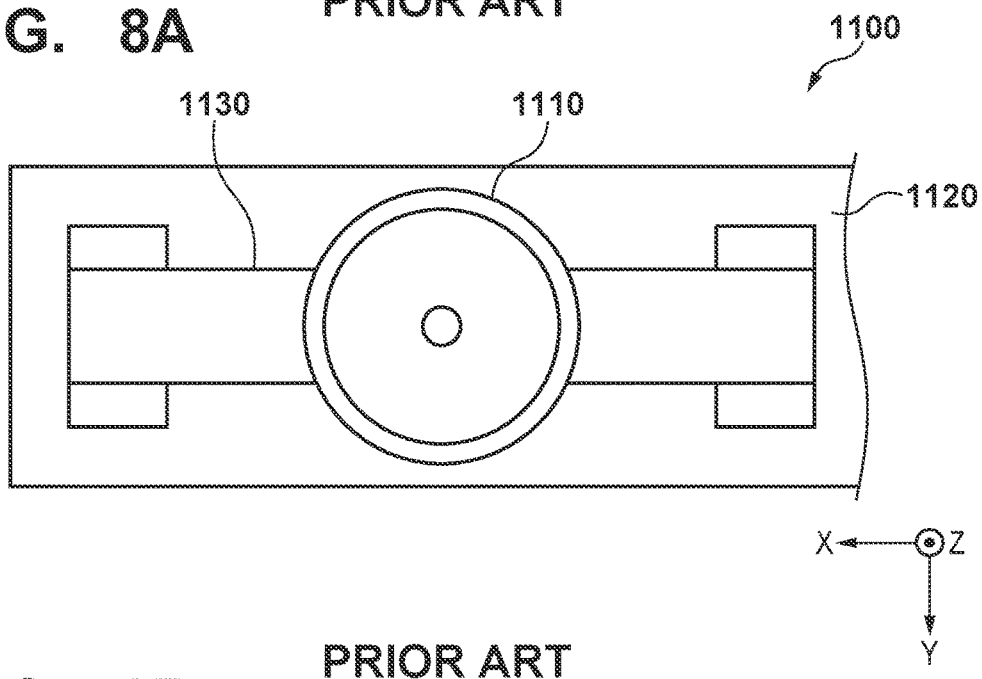
FIG. 8A to FIG. 8C are views showing a configuration of the suction pad unit in a conventional technique.
Figure 8B:
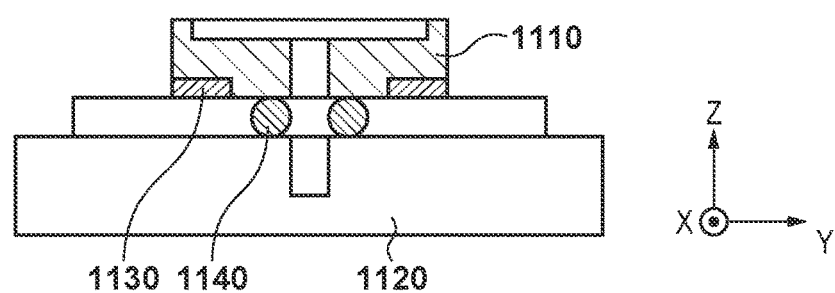
Figure 8C:
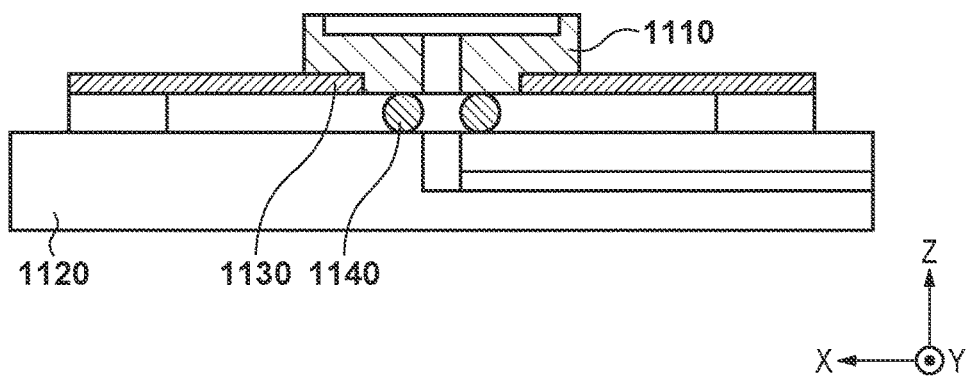

Here, a suction pad unit 1100 of a conventional technique will be described. FIG. 8A is a plan view of the suction pad unit 1100. FIG. 8B is a YZ cross-sectional view of the suction pad unit 1100. FIG. 8C is a ZX cross-sectional view of the suction pad unit 1100. In the suction pad unit 1100, as shown in FIG. 8A to FIG. 8C, a leaf spring 1130, which is fixed to a base 1120, supports a pad 1110 at two points, in other words it supports the pad 1110 by two support units that extend in the X direction. Also, an O ring 1140 is arranged between the base 1120 and the pad 1110. In such a case, regarding flexibility in the Z tilt direction, there is more flexibility in the $\omega x$ direction, and less flexibility in the $\omega y$ direction.

Figure 9A:
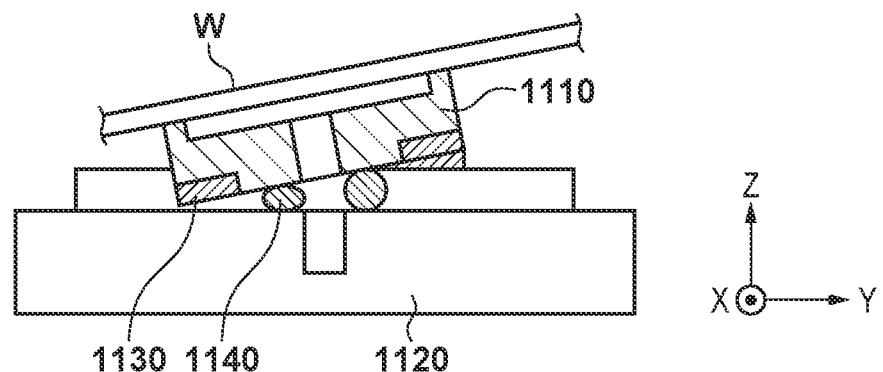
FIG. 9A and FIG. 9B are views showing a configuration of the suction pad unit in a conventional technique.
Figure 9B:
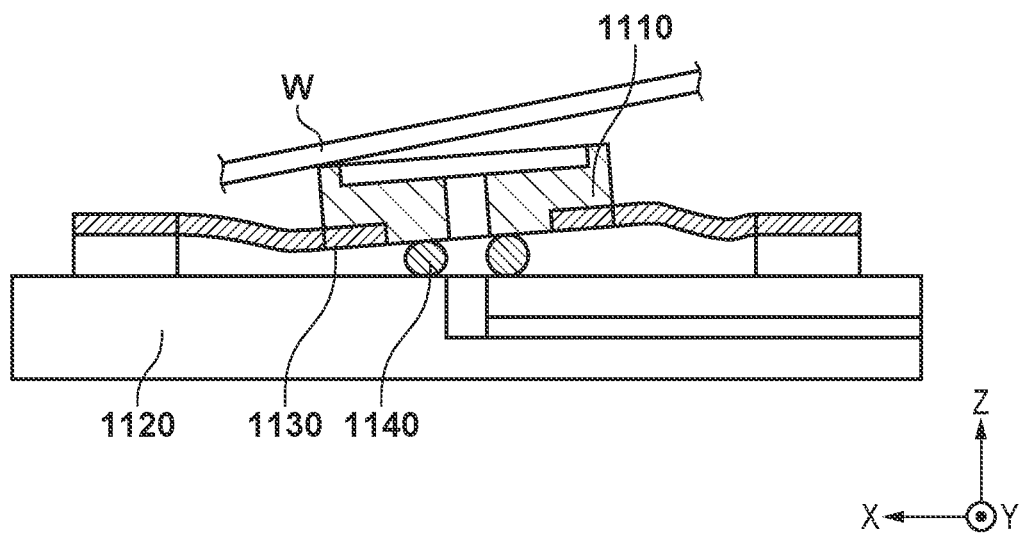

The leaf spring 1130 is configured by an SUS (stainless steel) material, for example, and has a thickness of 0.03 mm, a width of 10 mm, and a length of 30 mm. In such a case, the order of the spring constant of the leaf spring 1130 is 10 N/m in the $\omega x$ direction and $10^{-1}$ N/m in the $\omega y$ direction, and there is a difference on the order of about 10 times. Accordingly, in the suction pad unit 1100, the amount of deformation in the $\omega y$ direction is insufficient, and as shown in FIG. 9A and FIG. 9B, the conveyed object W cannot be suctioned well since (the suction surface of) the pad 1110 does not completely conform to the conveyed object W. Here, lowering the rigidity in the $\omega y$ direction such that the pad 1110 conforms to the conveyed object W can be considered, but since the rigidity in the XY plane direction also ends up becoming lower, it is difficult to hold the conveyed object W with high positioning accuracy.

Accordingly, in the present embodiment, by the leaf spring 3 supporting the pad 1 at three points or more, the rigidity of the $\omega x$ direction and the rigidity of the $\omega y$ direction are made to be approximately equal, and the rigidity in the XY plane direction is maintained. Accordingly, even in the case where the conveyed object is a reconfiguration substrate as shown in FIG. 7A to FIG. 7C, it is possible to maintain high positioning accuracy in the X-axis direction and the Y-axis direction while causing the pad 1 to conform to the conveyed object.

Also, in the case where a plurality of suction pad units 11 are provided in the base 2, differences may arise in the heights of (the suction surfaces of) the pads 1 and the plane parallelism due to the tolerance of members and assembly error. However, in the present embodiment, it is possible to absorb such differences by the pad 1 tilting by the leaf spring 3 and the O ring 4 deforming in each of the plurality of suction pad units 11.

Also, in the case where the conveyed object is passed from the conveyance hand 10 to a particular target, in order to inhibit damage to the conveyed object, the suction on the conveyed object is typically released. At that time, the conveyed object ceases to be held by the conveyance hand 10, and there is the possibility that the positioning accuracy of the conveyed object will decrease due to vibration in surrounding units or the like. In the present embodiment, as described above, since the O ring 4 can contact and separate in relation to the pad 1, the area where the O ring 4 is in contact with the pad 1 is smaller than the area over which the pad 1 is suctioning the conveyed object. Accordingly, even if the conveyed object is transferred in a state in which the conveyance hand 10 suctions the conveyed object, the O ring 4 separates from the pad 1 and air is released between the O ring 4 and the pad 1 before the pad 1 separates from the conveyed object. For that reason, in the present embodiment, even if the conveyed object is transferred in a state in which the conveyance hand 10 suctions the conveyed object, it is possible to inhibit damage to the conveyed object.

Also, in a case where the conveyed object is a substrate, there are cases in which when the substrate is charged, the pattern for manufacturing the semiconductor device formed on the substrate is damaged due to an ESD (electro-static discharge). Accordingly, the conveyance hand 10 must be configured by a material having an appropriate conductivity. Thus, in the present embodiment, by the pad 1 being configured by a material having conductivity, specifically by a ceramic, and the leaf spring 3 being configured by an SUS material, the conductivity from the pad 1 suctioning the conveyed object to the base 2 is ensured, and charging of the conveyed object is inhibited. Here, the conductivity of the pad 1 may be $10^3$ Ω–cm to $10^8$ Ω–cm, at which there is charge inhibition. Meanwhile, in a case where the leaf spring 3 is configured by a conductor such as an SUS material, it is possible to inhibit an ESD by forming an insulating layer by applying insulation processing to the surface of the leaf spring 3.

In this way, the present embodiment can provide a conveyance hand 10 that is advantageous at holding the conveyed object at a high positioning accuracy.

Figure 10:
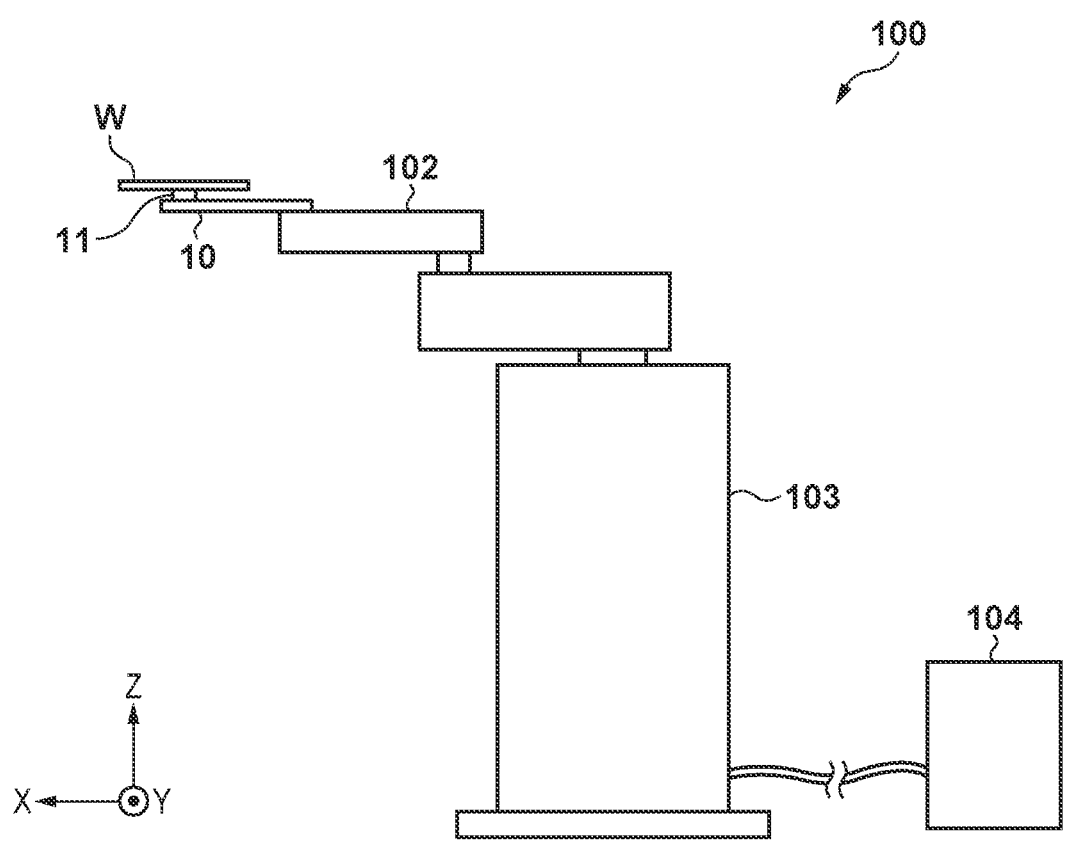
FIG. 10 is a schematic view showing a configuration of a conveyance apparatus according to an aspect of the present invention.

With reference to FIG. 10, a conveyance apparatus will be described as one aspect of the present invention. FIG. 10 is a schematic view showing a configuration of a conveyance apparatus 100 according to an aspect of the present invention. The conveyance apparatus 100 conveys a substrate (a wafer or a glass plate) which is the conveyed object to a substrate stage or the like.

The conveyance apparatus 100 includes the conveyance hand 10 for holding the conveyed object W, an arm portion 102 for supporting the conveyance hand 10 and capable of moving, and a driving unit 103 for driving the arm portion 102. Also, the conveyance apparatus 100 includes an exhaust unit 104 that is connected via a duct to suction pad units 11 of the conveyance hand 10 and that controls suctioning (vacuum suction) of the conveyed object W (in other words, exhausts air of the suction groove 1a). Since the conveyance apparatus 100 employs the conveyance hand 10 which is advantageous for holding the conveyed object W at high positioning accuracy, it is able to convey the conveyed object W while holding it with high positioning accuracy.

Figure 11:
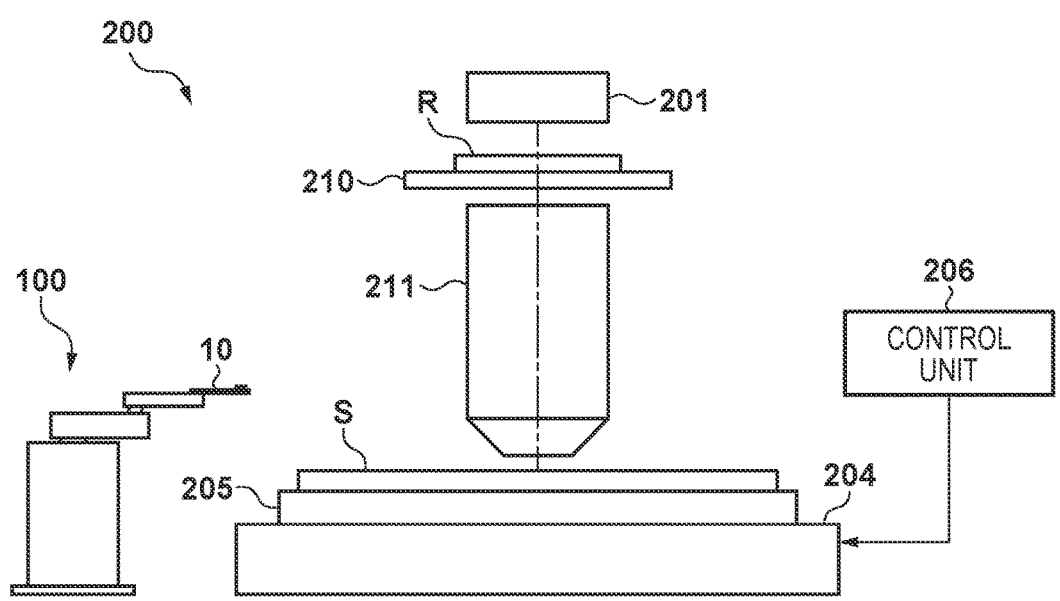
FIG. 11 is a schematic view showing a configuration of an exposure apparatus according to an aspect of the present invention.

With reference to FIG. 11, the exposure apparatus will be described as one aspect of the present invention. FIG. 11 is a schematic view showing a configuration of an exposure apparatus 200 according to an aspect of the present invention. The exposure apparatus 200 is a lithography apparatus that is employed in a lithography process which is a manufacturing process for a semiconductor device or a liquid crystal display device, and forms a pattern on a substrate. The exposure apparatus 200 employs a step-and-repeat method, for example, and transfers the pattern formed on a reticle R to the substrate S.

The exposure apparatus 200, as shown in FIG. 11, includes an illumination optical system 201, a reticle stage 210, a projecting optical system 211, a substrate stage (holding unit) 204, the conveyance apparatus 100, and a control unit 206.

The illumination optical system 201 illuminates the reticle R with light emitted from a light source (not shown). The reticle R is an original on which a pattern (for example, a circuit pattern) to be transferred to the substrate S is formed, and is configured by quartz glass, for example. The reticle stage 210 holds the reticle R, and moves in each direction on the X-axis and the Y-axis.

The projecting optical system 211 projects light that passed through the reticle R onto the substrate S at a predetermined magnification factor (for example, ½). The substrate S is a substrate consisting of a single crystal silicon, for example, and a resist (photoresist) is applied on the surface thereof. The substrate stage 204 holds the substrate S via a chuck 205, and moves in each direction of the X-axis and the Y-axis at least. The control unit 206 is configured by a computer including a CPU, a memory, or the like, for example, and controls each unit of the exposure apparatus 200 comprehensively in accordance with a program.

The exposure apparatus 200 employs the conveyance apparatus 100 which conveys the substrate S as the conveyed object to the substrate stage 204. Accordingly, since the exposure apparatus 200 can convey the substrate S while holding it with higher positioning accuracy in relation to the substrate stage 204, position shift of the substrate S on the substrate stage 204 can be reduced, and thereby a yield can be improved, for example.

A method of manufacturing an article in an embodiment of the present invention is suitable for manufacturing an article such as a device (a semiconductor element, a magnetic storage medium, a liquid crystal display element, or the like), for example. Such a method of manufacturing includes a step of exposing (forming a pattern on a substrate) a substrate, on which a photoresist was applied, by using the exposure apparatus 200, and a step of developing (processing the substrate) the substrate after it is exposed. Also, such a method of manufacturing may include other known steps (oxidation, depositing, vapor deposition, doping, planarization, etching, resist stripping, dicing, bonding, packaging, or the like). The method of manufacturing an article in the present embodiment, compared to conventional methods, is advantageous in at least one of product capability, quality, productivity, and manufacturing cost.

In the present invention the lithography apparatus is not limited to an exposure apparatus, and application to a lithography apparatus such as an imprint apparatus, a drawing apparatus, or the like is possible. Here, by the imprint apparatus causing an imprint material supplied onto a substrate and a mold to contact, and applying energy for curing to the imprint material, a cured product to which the pattern of the mold is transferred is formed. Also, the drawing apparatus forms a pattern (latent image pattern) on the substrate by performing rendering on the substrate by a charged particle beam (electron beam) or a laser beam. The above described method of manufacturing the article may be performed using these lithography apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2017-107066 filed on May 30, 2017 which is hereby incorporated by reference herein in its entirety.

What is claimed is:

1. A conveyance hand for holding a conveyed object, the conveyance hand comprising:
    a base;
    a pad configured to suction the conveyed object; and
    a support member disposed on the base and configured to support the pad,
    wherein the support member is configured to support the pad by three or more support portions configured to deform elastically respectively to tilt the pad in respective directions different from each other, and
    wherein the three or more support portions are configured to deform so that the pad conforms to a shape of the conveyed object disposed on the pad.

2. The conveyance hand according to claim 1, wherein the support member supports the pad so as to enable displacement of the pad in the vertical direction and to restrict displacement of the pad in the horizontal direction.

3. The conveyance hand according to claim 1, wherein the pad has a cross sectional shape, that is circular, in a direction along a suction surface where the pad suctions the conveyed object, and
  each of the three or more support portions includes a curved portion that extends along a periphery of the pad from a contact portion at which the support portion is in contact with the pad.

4. The conveyance hand according to claim 3, wherein the curved portions of each of the three or more support portions extend in the same direction along a periphery of the pad.

5. The conveyance hand according to claim 4, wherein the support member includes a connecting portion that connects an end of each of the three or more support portions on a side opposite an end on a side that is in contact with the pad, and is fixed to the base via the connecting portion,
  wherein the curved portion of each of the three or more support portions has a total length that is longer than a distance between a center position of the pad and a fixing position at which the connecting portion is fixed to the base.

6. The conveyance hand according to claim 5, wherein the connecting portion has an annular shape.

7. The conveyance hand according to claim 1, wherein the three or more support portions are arranged with rotational symmetry about a center of the pad.

8. The conveyance hand according to claim 1, wherein the each of the three or more support portions is a leaf spring.

9. The conveyance hand according to claim 1, further comprising an O ring arranged between the base and the pad so as to contact with a top surface of the base and a bottom surface of the pad.

10. The conveyance hand according to claim 9, wherein the pad includes a suction groove for suctioning the conveyed object and a through hole that penetrates the suction groove and the bottom surface of the pad, and
  the base includes an exhaust hole, wherein one end of the exhaust hole communicates with an exhaust unit for exhausting air of the suction groove, and the other end of the exhaust hole communicates with the through hole, and
  the O ring is arranged between the base and the pad so as to form a channel through, inside the O ring, which communicates with the through hole and the exhaust hole.

11. The conveyance hand according to claim 9, wherein the O ring is fixed to the base, and the O ring and the pad are configured to be separated from each other.

12. The conveyance hand according to claim 1, wherein the support member is configured be a material having conductivity.

13. The conveyance hand according to claim 1, wherein an insulating layer is formed on a surface of the support member.

14. The conveyance hand according to claim 1, wherein the conveyance hand has conductivity from the pad to the base.

15. The conveyance hand according to claim 1, wherein the plurality of directions includes two rotary directions respectively around two axes perpendicular to each other in a horizontal plain.

16. The conveyance hand according to claim 1, wherein the support member includes exactly three portions each configured to support the pad.

17. A conveyance apparatus for conveying a conveyed object, the apparatus comprising:
  a conveyance hand configured to hold the conveyed object;
  an arm portion configured to support the conveyance hand; and
  a driving unit configured to drive the arm portion,
  wherein the conveyance hand includes:
  a base;
  a pad configured to suction the conveyed object; and
  a support member disposed on the base and configured to support the pad,
  wherein the support member is configured to support the pad by three or more support portions configured to deform elastically respectively to tilt the pad in respective directions different from each other, and
  wherein the three or more support portions are configured to deform so that the pad conforms to a shape of the conveyed object disposed on the pad.

18. A lithography apparatus for forming a pattern on a substrate, the apparatus comprising:
  a holding unit configured to hold the substrate; and
  a conveyance apparatus configured to convey the substrate as a conveyed object to the holding unit,
  wherein the conveyance apparatus includes:
  a conveyance hand configured to hold the conveyed object;
  an arm portion configured to support the conveyance hand; and
  a driving unit configured to drive the arm portion, and
  the conveyance hand includes:
  a base;
  a pad configured to suction the conveyed object; and
  a support member disposed on the base and configured to support the pad,
  wherein the support member is configured to support the pad by three or more support portions configured to deform elastically respectively to tilt the pad in respective directions different from each other, and
  wherein the three or more support portions are configured to deform so that the pad conforms to a shape of the conveyed object disposed on the pad.

19. A method of manufacturing an article, the method comprising:
  forming a pattern on a substrate by using a lithography apparatus;
  processing the substrate after the pattern is formed thereon; and
  manufacturing the article from the processed substrate,
  wherein the lithography apparatus includes:
  a holding unit configured to hold the substrate; and
  a conveyance apparatus configured to convey the substrate as a conveyed object to the holding unit, and
  the conveyance apparatus includes:
  a conveyance hand configured to hold the conveyed object;
  an arm portion configured to support the conveyance hand; and
  a driving unit configured to drive the arm portion, and
  the conveyance hand includes:
  a base;
  a pad configured to suction the conveyed object; and
  a support member disposed on the base and configured to support the pad,
  wherein the support member is configured to support the pad by three or more support portions configured to deform elastically respectively to tilt the pad in respective directions different from each other, and wherein the three or more support portions are configured to deform so that the pad conforms to a shape of the conveyed object disposed on the pad.

20. A holding mechanism, to be used in a conveyance hand, for holding a conveyed object, the mechanism comprising:
a pad configured to suction the conveyed object; and
a support member disposed on a base and configured to support the pad,
wherein the support member is configured to support the pad by three or more support portions configured to deform elastically respectively to tilt the pad in respective directions different from each other, and
wherein the three or more support portions are configured to deform so that the pad conforms to a shape of the conveyed object disposed on the pad.

* * * * *